United States Patent
Guilardi

(10) Patent No.: US 10,781,094 B2
(45) Date of Patent: Sep. 22, 2020

(54) PRESSURE SENSOR ASSEMBLY MOUNTED TO A CERAMIC SUBSTRATE

(71) Applicant: TE CONNECTIVITY CORPORATION, Berwyn, PA (US)

(72) Inventor: Brian Ward Guilardi, San Jose, CA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 312 days.

(21) Appl. No.: 15/790,182

(22) Filed: Oct. 23, 2017

(65) Prior Publication Data

US 2019/0119103 A1    Apr. 25, 2019

(51) Int. Cl.
| | | |
|---|---|---|
| G01L 19/04 | (2006.01) | |
| B81B 7/00 | (2006.01) | |
| G01L 9/00 | (2006.01) | |
| G01L 19/00 | (2006.01) | |
| B81C 1/00 | (2006.01) | |

(52) U.S. Cl.
CPC ........ *B81B 7/0061* (2013.01); *B81C 1/00309* (2013.01); *G01L 9/0042* (2013.01); *G01L 9/0054* (2013.01); *G01L 9/0055* (2013.01); *G01L 19/0069* (2013.01); *G01L 19/04* (2013.01); *B81B 2201/0264* (2013.01); *B81B 2203/0127* (2013.01); *B81B 2207/098* (2013.01); *B81C 2203/035* (2013.01)

(58) Field of Classification Search
None
See application file for complete search history.

(56) References Cited

U.S. PATENT DOCUMENTS

| | | | | |
|---|---|---|---|---|
| 4,772,523 | A * | 9/1988 | Mace | C03C 17/40 257/418 |
| 5,600,071 | A * | 2/1997 | Sooriakumar | G01L 9/0055 73/721 |
| 5,994,161 | A * | 11/1999 | Bitko | B81B 7/0012 438/50 |
| 6,148,673 | A * | 11/2000 | Brown | G01L 19/0038 257/676 |
| 6,351,996 | B1 | 3/2002 | Nasiri et al. | |
| 7,152,483 | B2 | 12/2006 | Mast | |
| 7,412,894 | B2 | 8/2008 | Ueyanagi et al. | |
| 7,475,597 | B2 * | 1/2009 | Brida | G01L 19/146 73/715 |
| 7,642,115 | B2 * | 1/2010 | Eriksen | C23C 14/021 257/E29.324 |
| 7,900,520 | B2 * | 3/2011 | Colombo | G01L 19/147 257/419 |
| 10,190,929 | B2 * | 1/2019 | Sato | B21K 21/12 |
| 10,209,156 | B2 * | 2/2019 | Huang | G01L 9/0054 |
| 2008/0054383 | A1 | 3/2008 | Eriksen et al. | |

(Continued)

*Primary Examiner* — Natalie Huls
*Assistant Examiner* — Jermaine L Jenkins

(57) ABSTRACT

A pressure sensor assembly includes a sensor die and a ceramic substrate. The sensor die has a first side and a second side that is opposite to the first side. The sensor die includes a silicon chip that has a diaphragm configured to be exposed to a working fluid. The sensor die includes one or more electrical sensing elements mounted on the diaphragm and configured to measure a pressure of the working fluid. The sensor die is mounted to the ceramic substrate via a solder layer that engages the ceramic substrate and the second side of the sensor die.

18 Claims, 4 Drawing Sheets

(56) References Cited

U.S. PATENT DOCUMENTS

2016/0282212 A1\* 9/2016 Beer .................... G01L 19/147
2017/0190570 A1 7/2017 Kwa et al.
2018/0313711 A1\* 11/2018 Sixtensson ............ G01L 19/145

\* cited by examiner

PRESSURE SENSOR ASSEMBLY MOUNTED TO A CERAMIC SUBSTRATE

BACKGROUND OF THE INVENTION

The subject matter herein relates generally to pressure sensor assemblies that are configured to measure the pressure of a working fluid.

Known pressure sensor assemblies or packages include a semiconductor pressure sensor die mounted on a substrate for structural support. The semiconductor pressure sensor die may be a microelectromechanical system (MEMS) device that has a small size on the order of micrometers. The substrate may be mounted to a housing, casing, or block, such as a transmission case of an automobile, allowing the pressure sensor die to measure the pressure of the oil within the case.

The known pressure sensor packages are typically designed to monitor relatively inert gases and/or non-aggressive (e.g., limited corrosivity, limited acidity, etc.) liquids in relatively comfortable environments, and are not able to reliably and sustainably function in harsh chemical environments and/or relatively high pressures. For example, some pressure sensor packages configured for use with relatively harsh chemicals, such as fuel, oil, urea, refrigerants, or the like, have ports through the substrate that allow the chemicals to impinge upon a bottom side of the pressure sensor die, while electrical elements are disposed on a top side of the pressure sensor die to protect the electrical elements from the chemicals.

Some pressure sensor dies are attached to the corresponding substrate using a soft adhesive, such as room temperature vulcanized (RTV) silicone rubber. But, the use of RTV silicone rubber has several drawbacks. For example, the RTV silicone rubber may have limited adhesive characteristics, such that the RTV silicone rubber can only reliably secure the sensor die to the substrate at pressures less than about 200 psi or the like. Therefore, the standard RTV silicon rubber generally is not used for high pressure applications up to 300 psi or greater. Furthermore, the RTV silicone rubber may not be able to withstand exposure to the harsh fluids, as some fuels are known to cause RTV silicone rubber to swell and other fluids may cause the RTV silicone rubber to deteriorate and lose adhesion.

Some known pressure sensor dies are attached to metal substrates using a metal solder material. But, the use of metal substrates with pressure sensor dies have several drawbacks, particularly at high temperatures (e.g., up to 150 degrees Celsius (C)) and at low temperatures (e.g., down to −40 degrees C.). For example, the metal substrates may have a coefficient of thermal expansion (CTE) that is significantly different from the CTE of the pressure sensor die. This CTE mis-match may result in high thermo-mechanical stresses on the pressure sensor die at high temperatures and low temperatures. The stresses on the pressure sensor die may induce errors (e.g., thermal hysteresis, pressure hysteresis, zero-offset stability, output stability under pressure, and other un-compensable errors) in the pressure sensor die, rendering the pressure sensor die inaccurate and effectively non-functional at measuring the pressure of the fluid at the level of accuracy required.

Accordingly, there is a need for a pressure sensor assembly that reliably provides accurate measurements of a working fluid even when exposed to a harsh environment, which may include high and low temperatures, corrosive fluids, high pressures, and the like.

SUMMARY OF THE INVENTION

In one embodiment, a pressure sensor assembly is provided that includes a sensor die and a ceramic substrate. The sensor die has a first side and a second side that is opposite to the first side. The sensor die includes a silicon chip that has a diaphragm configured to be exposed to a working fluid. The sensor die includes one or more electrical sensing elements mounted on the diaphragm and configured to measure a pressure of the working fluid. The sensor die is mounted to the ceramic substrate via a solder layer that engages the ceramic substrate and the second side of the sensor die.

In another embodiment, a method (e.g., for assembling a pressure sensor assembly) is provided that includes providing a sensor die that has a first side and a second side that is opposite to the first side. The sensor die includes a silicon chip that defines the first side. The silicon chip has a diaphragm configured to be exposed to a working fluid. The sensor die includes one or more electrical sensing elements mounted on the diaphragm and configured to measure a pressure of the working fluid. The method includes applying a substrate metallization layer on a die-facing side of a ceramic substrate. The method also includes soldering the ceramic substrate to the sensor die by applying a solder layer between the substrate metallization layer and the second side of the sensor die.

In another embodiment, a pressure sensor assembly is provided that includes a sensor die and a ceramic substrate. The sensor die has a first side and a second side that is opposite to the first side. The sensor die includes a silicon chip that defines the first side. The silicon chip has a diaphragm configured to be exposed to a working fluid. The sensor die includes one or more electrical sensing elements mounted on the diaphragm and configured to measure a pressure of the working fluid. The sensor die includes a die metallization layer disposed on the second side of the sensor die. The ceramic substrate includes a substrate metallization layer disposed on a die-facing side of the ceramic substrate. The sensor die is mounted to the ceramic substrate via a solder layer that engages both the die metallization layer of the sensor die and the substrate metallization layer of the ceramic substrate.

DETAILED DESCRIPTION OF THE INVENTION

Certain embodiments of the present disclosure provide a pressure sensor assembly that is configured to reliably and accurately measure the pressure of a working fluid in harsh conditions. For example, the pressure sensor assembly according to one or more embodiments may be configured to operate in a broad temperature range that includes cold temperatures down to at least −40 degrees C. and hot temperatures up to at least 150 degrees C. In addition, the pressure sensor assembly may be configured to withstand harsh media, such as oil, fuel, urea, refrigerants, and the like. The pressure sensor assembly in one or more embodiments may be configured to measure the pressure of a working fluid at a pressure range that extends up to 1500 psi or more.

Figure 1:
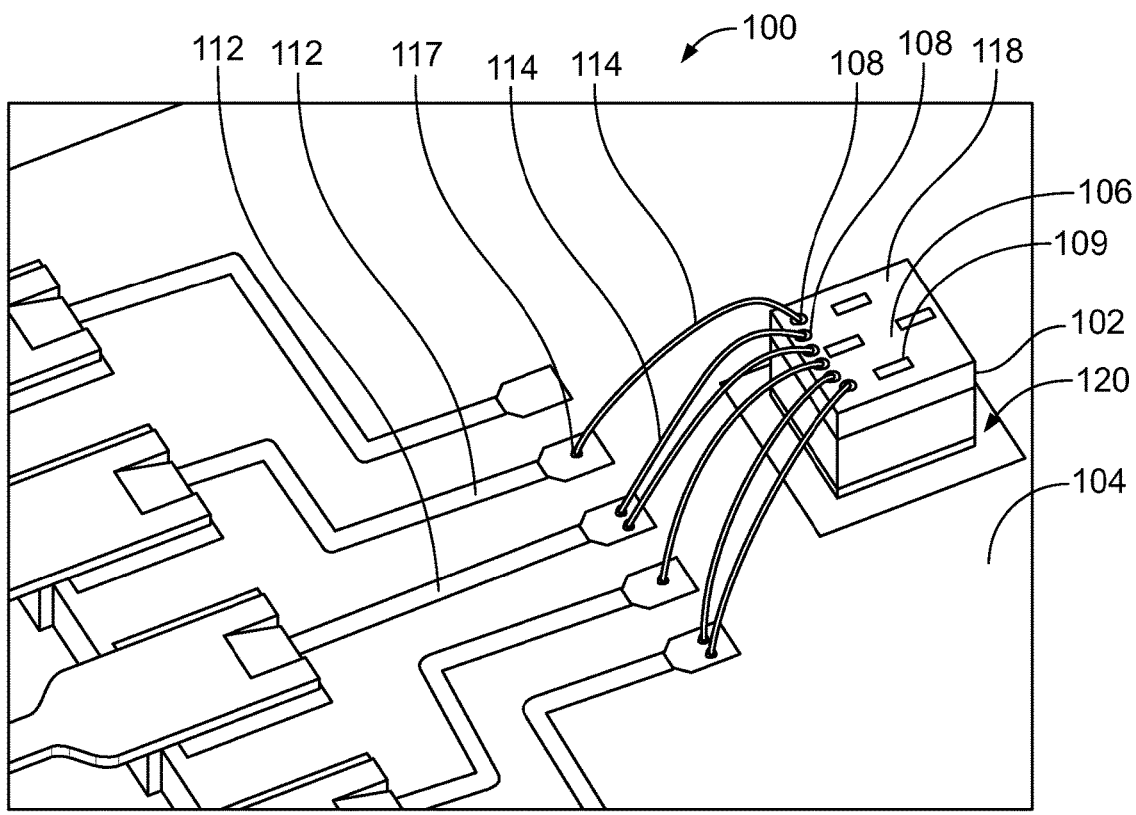
FIG. 1 is a perspective view of a portion of a pressure sensor assembly according to an embodiment.

FIG. 1 is a perspective view of a portion of a pressure sensor assembly 100 according to an embodiment. The pressure sensor assembly 100 includes a sensor die 102 mounted to a substrate 104. The pressure sensor assembly 100 is configured to measure the pressure of a working fluid that impinges on the sensor die 102. The pressure sensor assembly 100 may be used in automotive applications to measure the pressure of fuel in a fuel tank, oil in a transmission case, and the like. The pressure sensor assembly 100 can also be used in various other applications, such as in other types of vehicles (e.g., rail vehicles, boats, aircraft, etc.), appliances, and industrial machinery.

The sensor die 102 is a semiconductor chip that includes a diaphragm 106 and electrical sensing elements 109 mounted on the diaphragm 106. The sensor die 102 in one or more embodiments is a microelectromechanical system (MEMS) device that has a size on the order of micrometers or millimeters. The sensor die 102 functions as a pressure transducer. For example, a pressure variation causes the diaphragm 106 to move or deform an amount corresponding to the magnitude of the pressure variation. The electrical sensing elements 109 detect the deformation of the diaphragm 106 and output a voltage signal that is proportional to the amount of deformation. The electrical sensing elements 109 are piezo-resistive elements (e.g., strain gauges, resistors, etc.), and the deformation of the diaphragm 106 affects the resistance of the elements 109.

The electrical sensing elements 109 are electrically connected to circuit elements 112 on the substrate 104 via wire bonds 114. Each of the wire bonds 114 includes a wire 116 that extends from a first side 118 of the sensor die 102 to a corresponding circuit element 112. The circuit elements 112 may be electrical traces in a circuit board. The wire bonds 114 are electrically connected to the circuit elements 112 via contact pads 117, and are electrically connected to the sensing elements 109 on the diaphragm 106 via wire bond pads 108. In the illustrated embodiment the substrate 104 on which the sensor die 102 is mounted is the printed circuit board that includes the circuit elements 112. The contact pads 117 and circuit elements 112 are spaced apart from a mounting area 120 of the substrate 104 that engages the sensor die 102, and the wire bonds 114 traverse the space. The voltage signals output by the sensing elements 109 are conveyed along the wire bonds 114 and the circuit elements 112 to processors (not shown), transmitters (not shown), or the like, for processing and/or communication of the measured pressure.

In the illustrated embodiment, the sensing elements 109 are disposed on a first side 118 of the sensor die 102 that faces away from the substrate 104. The first side 118 is referred to herein as a top side 118 of the sensor die 102. As used herein, relative or spatial terms such as "top," "bottom," "front," "rear," "upper," and "lower" are only used to distinguish the referenced elements and do not necessarily require particular positions or orientations relative to gravity or to the surrounding environment of the pressure sensor assembly 100. In an alternative embodiment, the sensing elements 109 may be mounted to a different portion of the sensor die 102 other than the top side 118.

The substrate 104 has a composition that includes a ceramic material. The substrate 104 may be referred to herein as ceramic substrate 104. The ceramic substrate 104 is attached to the sensor die 104 via a metal solder layer 201 (shown in FIG. 2). Although the ceramic substrate 104 is a printed circuit board in the illustrated embodiment, the substrate 104 is not limited to a planar circuit board and may have other shapes.

Figure 2:
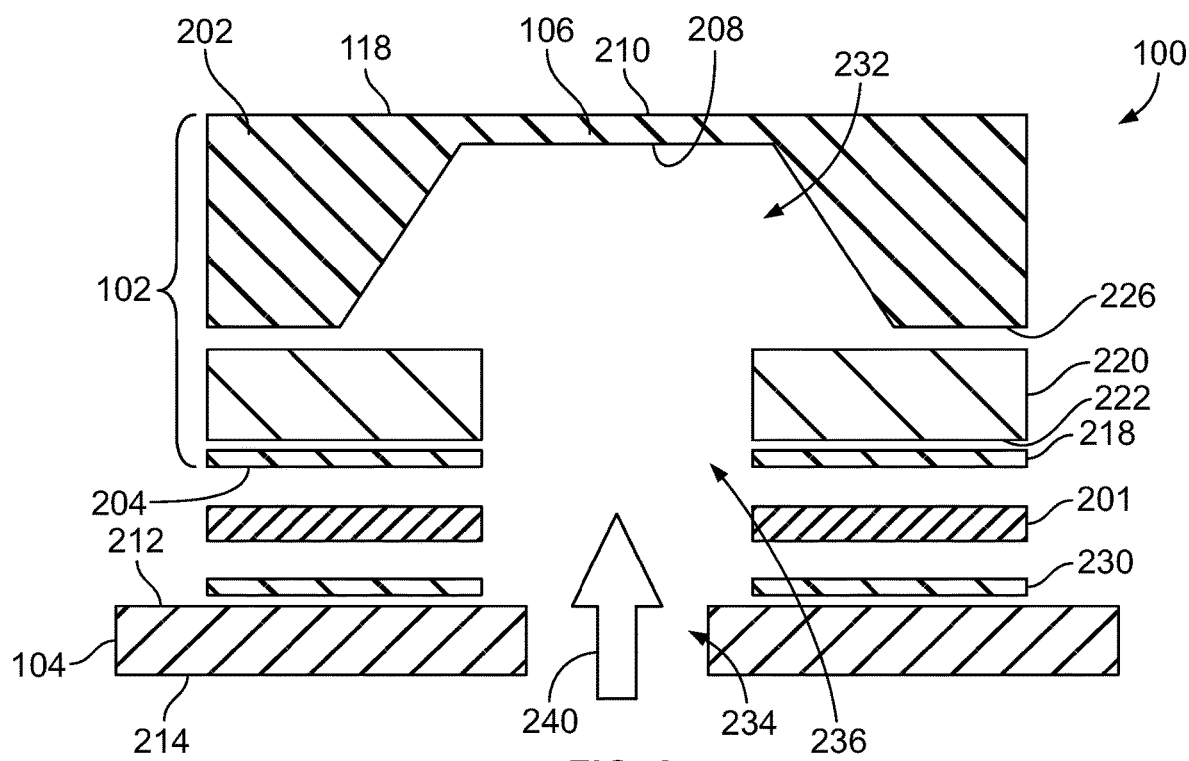
FIG. 2 is an exploded cross-sectional view of the pressure sensor assembly according to an embodiment.

FIG. 2 is an exploded cross-sectional view of the pressure sensor assembly 100 according to an embodiment. The pressure sensor assembly 100 includes the sensor die 102, the ceramic substrate 104, and the metal solder layer 201 disposed between the sensor die 102 and the substrate 104. The solder layer 201 is used to mechanically secure the sensor die 102 to the substrate 104. The electrical sensing elements 109 and wire bonds 114 are omitted in FIG. 2.

In an embodiment, the sensor die 102 includes the first side 118 and a second side 204 that is opposite to the first side 118. The second side 204 faces towards the ceramic substrate 104 and engages the solder layer 201. In the illustrated orientation, the first side 118 is a top side 118 and the second side 204 is a bottom side 204. The sensor die 102 includes a silicon chip 202 that is composed of silicon. The silicon chip 202 defines the top side 118 of the sensor die 102 in the illustrated embodiment. The silicon chip 202 includes the diaphragm 106. The diaphragm 106 is located along the top side 118 in a central area of the sensor die 102. The diaphragm 106 has a reduced thickness relative to other portions of the sensor die 102, which allows the diaphragm 106 to move (e.g., deform) based on pressure variations. The diaphragm 106 is configured to be exposed to a working fluid, such that the working fluid impinges upon an inner side 208 or an opposite outer side 210 of the diaphragm 106. The inner side 208 faces towards the ceramic substrate 104.

The ceramic substrate 104 has a die-facing side 212 that faces the sensor die 102. In the illustrated embodiment, the ceramic substrate 104 is a planar board, and includes a back side 214 that is opposite the die-facing side 212. In an embodiment, the ceramic substrate 104 has a composition that includes alumina (e.g., aluminum oxide). The ceramic substrate 104 may be composed of 100% alumina, or may include additional compounds and/or components other than alumina. For example, the ceramic substrate 104 may be mostly alumina by weight, such as 80% or 90% alumina. In other embodiments, the composition of the ceramic substrate 104 may have one or more other ceramic materials instead of alumina, such as metal oxides other than aluminum.

The solder layer 201 engages the bottom side 204 of the sensor die 102 and the die-facing side 212 of the ceramic substrate 104 to attach the sensor die 102 to the ceramic substrate 104. The solder layer 201 has a metal alloy composition that includes tin, and may include additional metals or other components. For example, the composition of the solder layer 201 may also include silver, copper, manganese, antimony, bismuth, nickel, lead, or indium among other metals and/or components. The metals in the solder layers 201 are able to withstand debris and corrosive working fluids, such as fuel, oil, refrigerants, and urea, without breaking down or swelling, unlike soft adhesives like silicone rubber.

In an embodiment, the sensor die 102 includes a die metallization layer 218 that engages the solder layer 201. The die metallization layer 218 is located along the bottom side 204 of the sensor die 102. The die metallization layer 218 may define the bottom side 204 of the die 102 or extend from the bottom side 204. The die metallization layer 218 has a composition that may include titanium, nickel, gold, chromium, and/or platinum. In an embodiment, a combination of at least some of these metals are applied sequentially on the bottom side 204 of the sensor die 102 such that the die metallization layer 218 includes distinct sub-layers (at least prior to soldering).

The sensor die 102 optionally includes a constraint base 220 that is mounted to the silicon chip 202. The constraint base 220 may be composed of glass or another crystalline ceramic material. The constraint base 220 is disposed between the silicon chip 202 and the solder layer 201. The constraint base 220 may be attached to the silicon chip 202 via anodic bonding or another method such as adhesive. In an embodiment, the die metallization layer 218 is disposed directly on a substrate-facing surface 222 of the constraint base 220. Optionally, as shown in FIG. 2, the die metallization layer 218 may substantially cover an entirety of the substrate-facing surface 222, such that the die metallization layer 218 engages and covers at least 90% or 95% of the surface area of the surface 222. Alternatively, the die metallization layer 218 may engage and cover only a portion (e.g., less than 90%) of the substrate-facing surface 222. In an alternative embodiment, the sensor die 102 may lack the constraint base 220, and the die metallization layer 218 is disposed directly on a substrate-facing surface 226 of the silicon chip 202.

The ceramic substrate 104 includes a substrate metallization layer 230 that is disposed on the die-facing side 212 of the ceramic substrate 104. The substrate metallization layer 230 engages the solder layer 201. The substrate metallization layer 230 has a composition that includes one or more metals. The composition of the substrate metallization layer 230 optionally may include platinum, palladium, and/or silver among other metals or components.

In an embodiment, the ceramic substrate 104 has a coefficient of thermal expansion (CTE) that is relatively close to the CTE of the glass constraint base 220. For example, in one working example of the pressure sensor assembly 100, the CTE of the ceramic substrate 104 differs from the CTE of the glass constraint base 220 by less than 5 ppm/degree C. This thermal expansion mismatch is relatively small compared to thermal expansion mismatches of known pressure sensor packages that use metal substrates, for example. Due to the relatively small mismatch, mechanical stresses transferred from the substrate 104 to the sensor die 102 at high temperatures and low temperatures are relatively weak and do not induce appreciable pressure measurement errors due to thermal hysteresis, pressure hysteresis, zero-offset stability, output stability under pressure, and other un-compensable errors. Therefore, the pressure sensor assembly 100 described herein may be more accurate and functional than the known pressure sensor packages when exposed to high temperatures (e.g., up to at least 150 degrees C.) and low temperatures (e.g., down to at least −40 degrees C.).

In an embodiment, the sensor die 102 defines a cavity 232 that extends through the bottom side 204 to the diaphragm 106. The diaphragm 106 extends across the cavity 232, and defines a ceiling or cap of the cavity 232. The cavity 232 extends fully through the die metallization layer 218 and the constraint base 220. For example, the cavity 232 may be a through-hole in the constraint base 220, and the die metallization layer 218 is subsequently applied on the substrate-facing surface 222 of the constraint base 220 such that the die metallization layer 218 circumferentially surrounds the cavity 232. The cavity 232 also extends partially through the silicon chip 202 from the substrate-facing surface 226 to the diaphragm 106. The ceramic substrate 104 defines an opening or port 234 that extends from the back side 214 through the die-facing side 212. The substrate metallization layer 230 on the die-facing side 212 of the ceramic substrate 104 circumferentially surrounds the opening 234.

The opening 234 in the ceramic substrate 104 at least partially aligns with the cavity 232 such that the opening 234 is fluidly connected to the cavity 232. The opening 234 and the cavity 232 together define a fluid channel 236. The solder layer 201 circumferentially surrounds the fluid channel 236. For example, the solder layer 201 defines a portion of the fluid channel 236 between the cavity 232 of the sensor die 102 and the opening 234 of the ceramic substrate 104. The fluid channel 236 is configured to receive a working or test fluid therein from below the back side 214 of the ceramic substrate 104. The working fluid enters the fluid channel 236 in a fluid entrance direction 240 and impinges on the inner side 208 of the diaphragm 106. The pressure exerted by the working fluid on the diaphragm 106 may be measured by the electrical sensing elements 109 (shown in FIG. 1) on the silicon chip 202. In an embodiment, the electrical sensing elements 109 are mounted on the outer side 210 of the diaphragm 106, and are not exposed to the working fluid within the fluid channel 236. For example, the diaphragm 106 provides a barrier that protects the sensing elements 109, the wire bonds 114 (FIG. 1), and other electronics from exposure to the working fluid, which may be corrosive.

Since the working fluid is introduced into the pressure sensor assembly 100 from below the ceramic substrate 104, the pressure exerted by the working fluid on the diaphragm 106 forces the sensor die 102 in a direction away from the ceramic substrate 104. The solder layer 201 in an embodiment has sufficient adhesive properties to withstand the pressure of the working fluid up to relatively high pressures, such as 1500 psi or more. The adhesives used in known pressure sensor packages, such as RTV silicone rubber, may fail at lower pressures (e.g., around 200 psi or 300 psi), resulting in the sensor die separating from the substrate.

Figure 3:
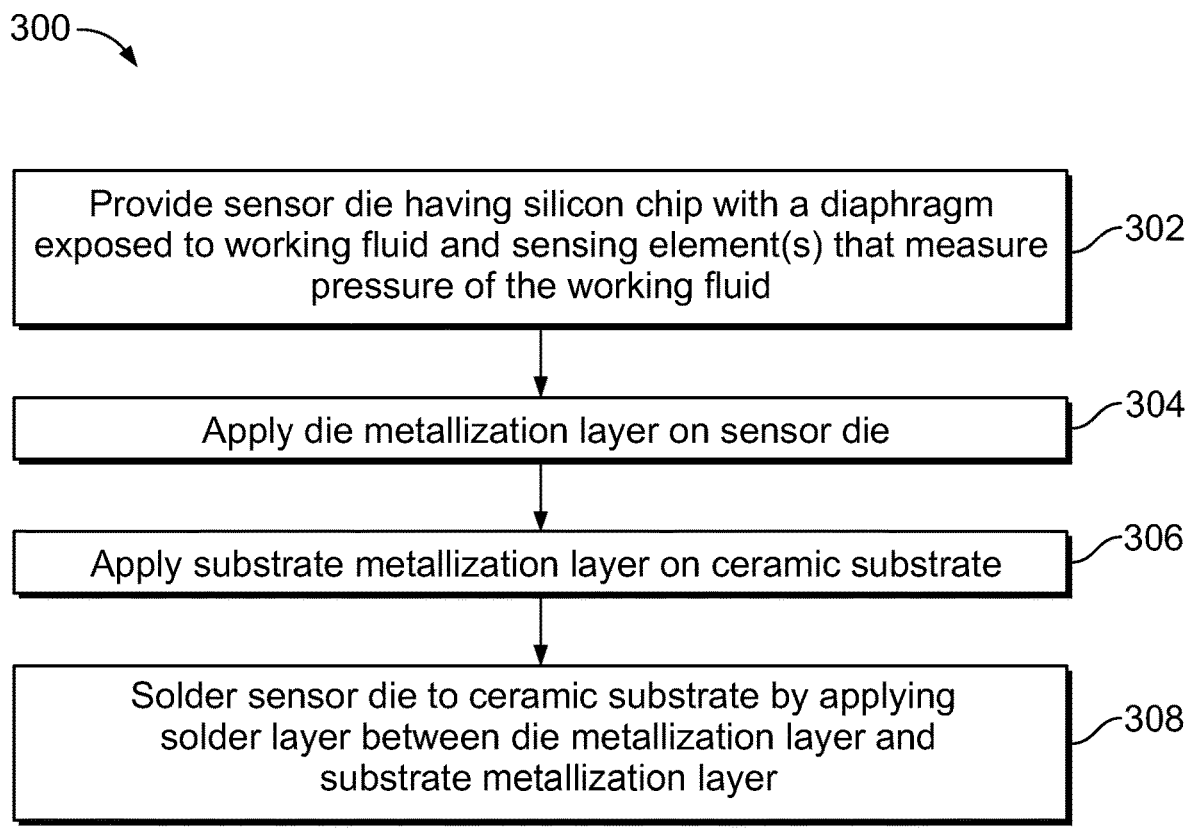
FIG. 3 is a flow chart of a method for assembling a pressure sensor assembly according to an embodiment.

FIG. 3 is a flow chart of a method 300 for assembling a pressure sensor assembly according to an embodiment. The pressure sensor assembly produced by the method 300 may be one or more of the embodiments of the pressure sensor assembly 100 shown in FIGS. 1, 2, 4, 5, and 6 herein. At 302, a sensor die is provided that has a silicon chip with a diaphragm exposed to a working fluid. The working fluid may be a relatively harsh liquid or gas, such as oil, fuel, urea, refrigerant, fuel vapor, or the like. The sensor die also includes one or more electrical sensing elements mounted on the silicon chip and configured to measure a pressure of the working fluid. The one or more sensing elements may be piezo-resistive elements that are configured to change resistivity and provide a voltage output based on deformation (e.g., displacement) of the diaphragm, such that the voltage output changes based on an extent of deformation of the diaphragm. The diaphragm has an inner side and an opposite, outer side. In an embodiment, the inner side is exposed to the working fluid that enters the sensor die through a cavity in the sensor die. The one or more sensing elements are mounted on the outer side of the diaphragm and are not exposed to the working fluid in the cavity.

At 304, a die metallization layer is applied on a side of the sensor die. For example, the diaphragm may be located at or proximate to a first side of the sensor die, and the die metallization layer may be applied on a second side of the sensor die that is opposite to the first side. The die metallization layer includes one or more metals, such as titanium, nickel, gold, chromium, and/or platinum. The metals may be applied via a sputtering process, a vapor deposition process, or the like. Optionally, the sensor die includes a constraint base that is composed of glass. The constraint base is attached to the silicon chip. The die metallization layer is applied directly on the constraint base along the second side of the sensor die. In an embodiment, the constraint base defines a portion of the cavity of the sensor die therethrough such that the working fluid flows through the constraint base along the cavity to the diaphragm. The die metallization layer on the constraint base circumferentially surrounds the cavity.

At 306, a ceramic substrate is provided and a substrate metallization layer is applied on a side of the ceramic substrate. The ceramic substrate has a composition that includes a ceramic material, such as alumina. In an embodiment, the composition of the ceramic substrate is at least 90% alumina. The ceramic substrate may be a planar board, such as a printed circuit board, or the ceramic substrate may have various other shapes such as, but not limited to, shapes designed to accept an axial or radial O-ring seal, a tapered crimp junction, a cylindrical structure, threading, etc. The substrate metallization layer has a composition that includes one or more metals such as platinum, palladium, and/or silver, among other metals or components. The substrate metallization layer may be applied on the ceramic substrate via screen printing, sputtering, vapor deposition, or the like. In an embodiment, the ceramic substrate defines an opening through the ceramic substrate from a back side to an opposite, die-facing side, onto which the substrate metallization layer is deposited. The opening in the ceramic substrate aligns with the cavity of the sensor die such that the combination of the opening and the cavity represent a fluid channel that allows the working fluid to flow through the ceramic substrate and a portion of the sensor die before impinging upon the diaphragm. The substrate metallization layer circumferentially surrounds the opening of the ceramic substrate.

At 308, the sensor die is soldered to the ceramic substrate by applying a solder layer between the die metallization layer on the sensor die and the substrate metallization layer on the ceramic substrate. The solder layer has a metal alloy composition that includes tin, and may include additional metals or other components such as silver, copper, manganese, antimony, bismuth, nickel, lead, and/or indium, among other metals or components. The solder layer is applied on the metallization layers such that the solder layer does not obstruct the fluid channel that extends through the sensor die and the ceramic substrate.

Figure 4:
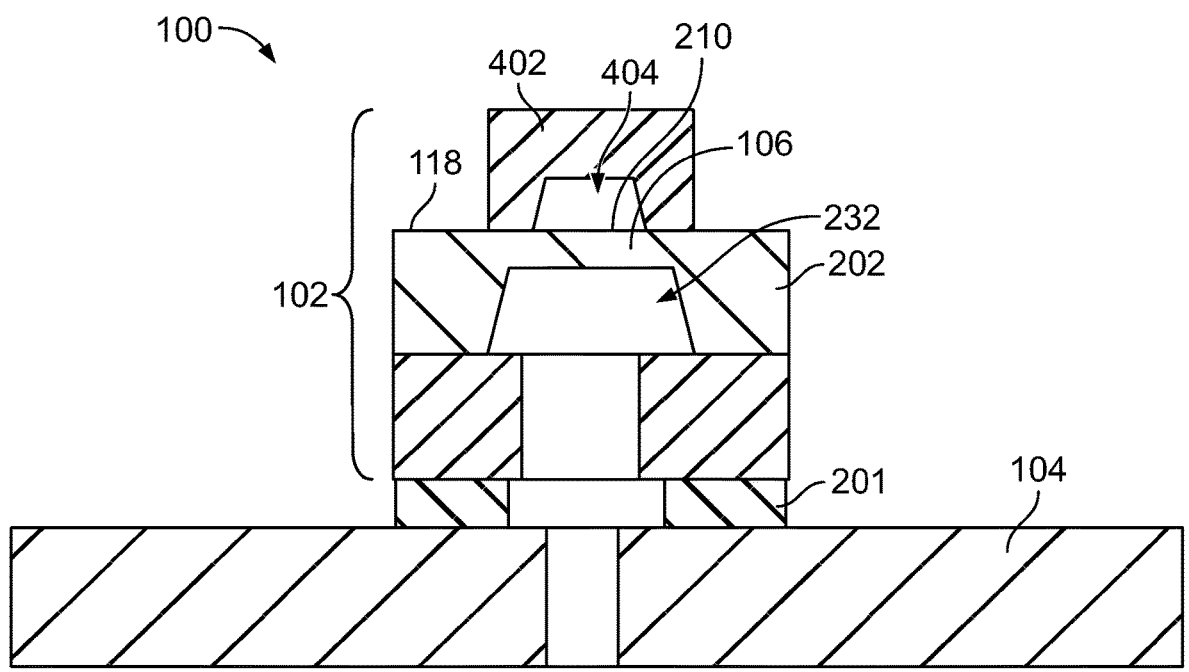
FIG. 4 is a cross-sectional view of the pressure sensor assembly according to another embodiment.

FIG. 4 is a cross-sectional view of the pressure sensor assembly 100 according to another embodiment. In the illustrated embodiment, the pressure sensor assembly 100 may be similar to the pressure sensor assembly 100 shown in FIG. 2 except for the addition of a vacuum cap 402 on the top side 118 of silicon chip 202. The vacuum cap 402 aligns with the diaphragm 106 of the silicon chip 202. The vacuum cap 402 defines a pocket or chamber 404 directly above the outer side 210 of the diaphragm 106. In an embodiment, the pocket 404 is under a vacuum, so the outer side 210 of the diaphragm 106 is not under pressure from air or another fluid outside of the cavity 232. With the addition of the vacuum cap 402, the sensor die 102 is an absolute pressure sensor die that is configured to measure an absolute pressure of the working fluid. The sensor die 102 shown in FIG. 2 that lacks the vacuum cap 402 is a gage pressure sensor die or a differential pressure sensor die that is configured to measure a relative or differential pressure of the working fluid. Thus, different types of pressure sensor dies may be mounted and secured to the ceramic substrate 104 via the solder layer 201 as described herein.

Figure 5:
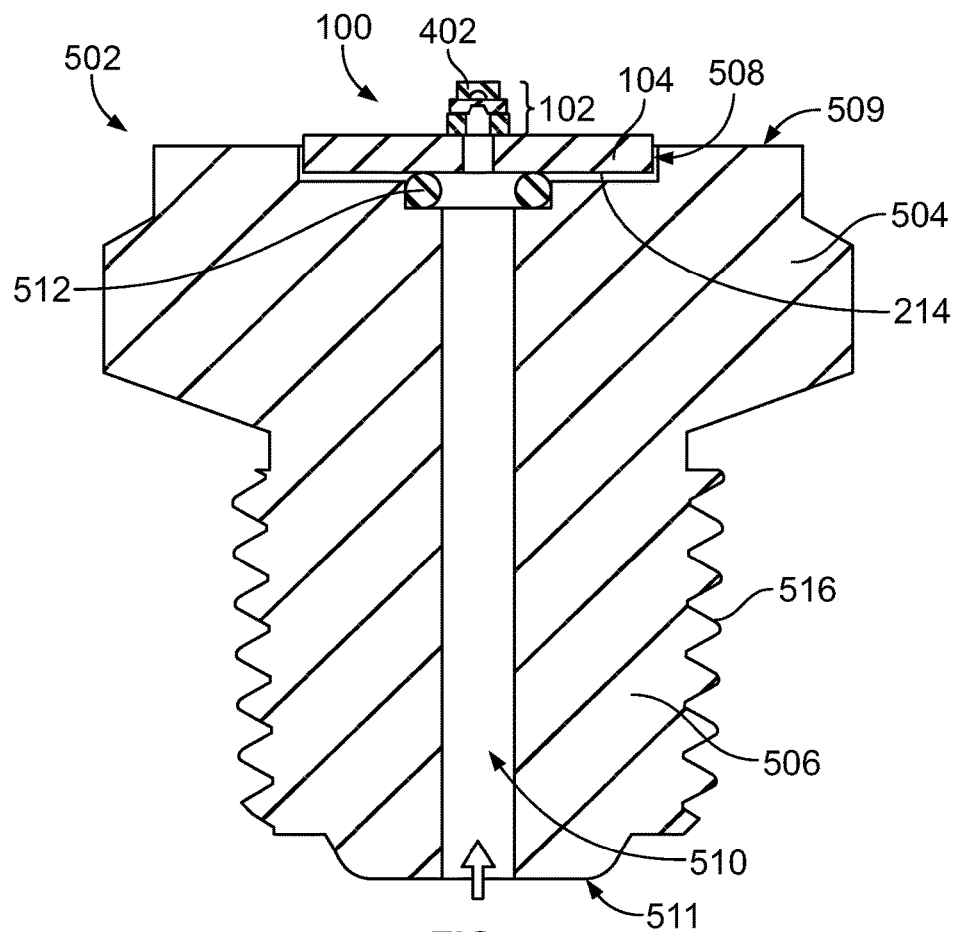
FIG. 5 is a side cross-sectional view of the pressure sensor assembly installed in a plug fitting according to one example application.

FIG. 5 is a side cross-sectional view of the pressure sensor assembly 100 installed in a plug fitting 502 according to one example application. The plug fitting 502 may be configured to be mounted to a vessel containing a working fluid, such as a fuel tank, a gear box (e.g., transmission case), or the like. The plug fitting 502 in the illustrated embodiment includes a head 504 and a stem 506 extending from the head 504. The head 504 defines a recess 508 at a top end 509 of the plug fitting 502 that receives the pressure sensor assembly 100. The stem 506 includes threads 516 for threadably coupling the plug fitting 502 to the corresponding fluid vessel. In an alternative embodiment, the threads 516 may be disposed along the head 504 instead of, or in addition to, the stem 506. In other embodiments, the stem 506 and/or the head 504 may include deformable ribs or other features for coupling the plug fitting 502 to the vessel instead of the threads 516.

The stem 506 defines a passage 510 that extends through the stem 506 from a bottom end 511 of the plug fitting 502 to the recess 508 in the head 504. The passage 510 is configured to allow a working fluid to enter the plug fitting 502 through the bottom end 511 and access the pressure sensor assembly 100. The plug fitting 502 includes at least one sealing member 512 to prevent the working fluid from leaking around edges of the ceramic substrate 104 in the recess 508. In the illustrated embodiment, the ceramic substrate 104 is a planar board, and the sealing member 512 is an axial O-ring that seals (e.g., face seals) to the back side 214 of the ceramic substrate 104. In other embodiments, the sealing member 512 may seal around an edge of the ceramic substrate 104 or the like.

In the illustrated embodiment, the sensor die 102 of the pressure sensor assembly 100 includes the vacuum cap 402, but may lack the vacuum cap 402 in other embodiments. Although not shown, the pressure sensor assembly 100 and/or the fitting 502 may include a hood or cover that encloses and protects the sensor die 102 from exposure to debris, contaminants, external impacts, humidity, and the like.

Figure 6:
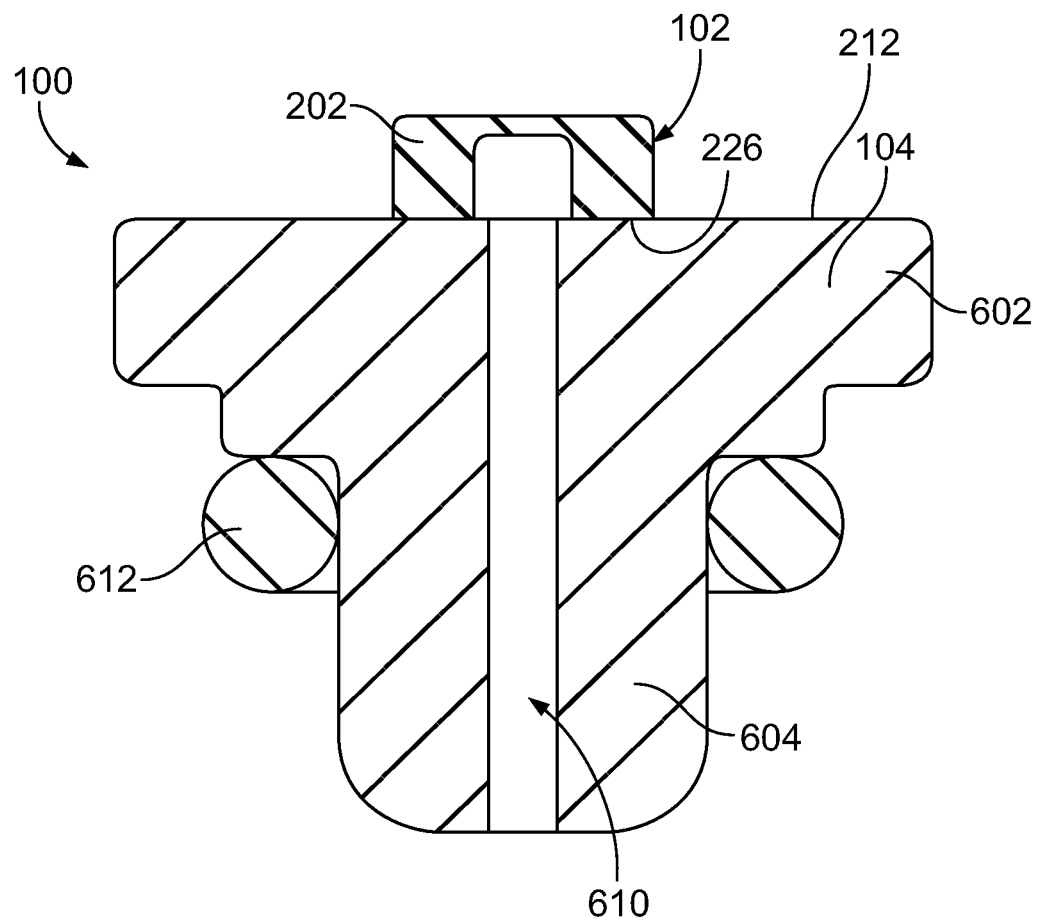
FIG. 6 is a side cross-sectional view of the pressure sensor assembly according to another example application.

FIG. 6 is a side cross-sectional view of the pressure sensor assembly 100 according to another example application. In the illustrated embodiment, the substrate 104 is a ceramic pellet that may be configured to be mounted directly to a vessel containing a working fluid, such as a fuel tank, a gear box (e.g., transmission case), or the like, without the use of a separate fitting (e.g., the fitting 502 shown in FIG. 5). For example, the substrate 104 includes a head portion 602 and a stem portion 604. The sensor die 102 is soldered to the die-facing side 212 of the substrate 104 along the head portion 602. The substrate 104 defines a passage 610 that extends continuously through the stem portion 604 and the head portion 602 to the sensor die 102, to allow the working fluid to access the sensor die 102. A radial O-ring seal 612 surrounds the stem portion 604 of the substrate 104 and is configured to prevent the working fluid from leaking around the outside of the substrate 104 out of the passage 610, as well as preventing external debris and contaminants from leaking into the passage 610.

In the illustrated embodiment, the sensor die 102 includes the silicon chip 202 but lacks the constraint base 220, which is shown in FIG. 2. For example, the die metallization layer 218 (FIG. 2) may be deposited directly onto the substrate-facing surface 226 of the silicon chip 202 for soldering the silicon chip 202 to the substrate 104.

The various embodiments of the pressure sensor assembly described with reference to FIGS. 1-6 herein have several advantages over known die attach methods. For example, the ceramic substrate of the pressure sensor assembly reduces thermo-mechanical stresses induced on the sensor die caused by thermal expansion mismatches upon exposure to low temperatures and high temperatures relative to some known metal and plastic substrates. The ceramic substrate may also be inherently better able to withstand high and low temperatures and harsh media, such as fuel, oil, urea, refrigerant, and the like, than the known metal and plastic substrates. Furthermore, the solder layer used to attach the sensor die to the ceramic substrate may have several advantageous properties. For example, the solder layer may have relatively high wetting and adhesion properties as well as a relatively low Young's modulus (e.g., high elasticity), reduced hardness, and lower fragility when compared to other types of solders. The properties of the solder layer allow the solder layer to repeatedly withstand, without failure, relatively high fluid pressures that push the sensor die in a direction away from the ceramic substrate. The solder layer may also have low inherent stresses after reflow and a low inter-metallic compound (IMC) production and reduced IMC growth over time (compared to known solders), such that the solder layer does not significantly consume the metals in the metallization layers during the soldering process or after aging in the harsh temperature and media environment.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely example embodiments. Many other embodiments and modifications within the spirit and scope of the claims will be apparent to those of ordinary skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A pressure sensor assembly comprising:
    a sensor die having a first side and a second side that is opposite to the first side, the sensor die including a silicon chip that has a diaphragm configured to be exposed to a working fluid, the sensor die including one or more electrical sensing elements mounted on the diaphragm and configured to measure a pressure of the working fluid; and
    a ceramic substrate to which the sensor die is mounted via a solder layer that engages a mounting surface of the ceramic substrate and the second side of the sensor die, wherein the ceramic substrate mounting surface is disposed along a partial portion of a top surface of the ceramic substrate, and wherein a remaining portion of the ceramic substrate top surface extends radially outwardly along a common plane from the mounting surface and away from and the sensor die second side;
    wherein the sensor die comprises a cavity that extends from the second side to the diaphragm, wherein the ceramic substrate has a die-facing side and a back side that is opposite the die-facing side, the ceramic substrate comprising an opening that extends through the ceramic substrate from the back side to the die-facing side, wherein the opening is aligned with the cavity forming a fluid channel to facilitate passage of the working fluid from the substrate to the diaphragm; and
    wherein one or both of the sensor die second side and the ceramic substrate die-facing side include a metallization layer in direct contact therewith and engaging the solder layer, wherein the metallization layer and solder layer are disposed around the fluid channel.

2. The pressure sensor assembly of claim 1, wherein the sensor die includes the metallization layer that is interposed between the second side and the solder layer.

3. The pressure sensor assembly of claim 2, wherein the sensor die includes a glass constraint base disposed between the silicon chip and the die metallization layer, wherein the sensor die second side is a surface of the glass constraint base opposite the sensor die.

4. The pressure sensor assembly of claim 1, wherein the metallization layer has a composition comprising one or more of titanium, nickel, gold, chromium, or platinum.

5. The pressure sensor assembly of claim 1, wherein the ceramic substrate includes the metallization layer that is interposed between the die-facing side of the ceramic substrate and the solder layer.

6. The pressure sensor assembly of claim 1, wherein the ceramic substrate has a composition that comprises alumina.

7. The pressure sensor assembly of claim 1, wherein the diaphragm has an inner side that faces the cavity and an outer side that is opposite to the inner side, the one or more electrical sensing elements mounted to the outer side of the diaphragm.

8. The pressure sensor assembly of claim 1, wherein the solder layer has a metal alloy composition that comprises tin and one or more of silver, copper, manganese, antimony, bismuth, nickel, lead, or indium.

9. The pressure sensor assembly of claim 1, wherein the sensor die is a microelectromechanical system (MEMS) device.

10. A method comprising:
    providing a sensor die that has a first side and a second side that is opposite to the first side, the sensor die including a silicon chip that defines the first side, the silicon chip having a cavity and a diaphragm at an end of the cavity that is configured to be exposed to a working fluid, the sensor die including one or more electrical sensing elements mounted on the diaphragm and configured to measure a pressure of the working fluid;
    applying a substrate metallization layer on a die-facing side of a ceramic substrate, wherein the substrate includes an opening extending therethrough and the metallization layer is disposed around the opening; and soldering the ceramic substrate to the sensor die by applying a solder layer between the substrate metallization layer and the second side of the sensor die, wherein the sensor die cavity is aligned with the substrate opening to form a fluid channel for passing a working fluid from the substrate to the cavity and diaphragm, and wherein the die-facing side of the ceramic substrate extends along a common plane that projects radially outwardly a distance beyond the sensor die second side such that an entirety of the sensor die second side is disposed opposite and adjacent the ceramic substrate die-facing side.

11. The method of claim 10, further comprising applying a die metallization layer on the second side of the sensor die prior to soldering the ceramic substrate to the sensor die, wherein the solder layer engages the die metallization layer.

12. The method of claim 11, wherein the sensor die includes a glass constraint base mounted to the silicon chip, the die metallization layer being applied on the glass constraint base.

13. The method of claim 10, wherein the substrate metallization layer is applied on the die-facing side of the ceramic substrate via one or more of screen-printing, sputtering, or vapor deposition.

14. The method of claim 10, wherein the ceramic substrate is soldered to the sensor die by applying the solder layer circumferentially around the fluid channel.

15. A pressure sensor assembly comprising:
a sensor die having a first side and a second side that is opposite to the first side, the sensor die including a silicon chip that defines the first side, the silicon chip having a cavity and a diaphragm at an end of the cavity that is configured to be exposed to a working fluid, the sensor die including one or more electrical sensing elements mounted on the diaphragm and configured to measure a pressure of the working fluid, the sensor die including a die metallization layer along the second side of the sensor die; and
a ceramic substrate including a substrate metallization layer disposed on a die-facing side of the ceramic substrate, wherein the sensor die is mounted to the ceramic substrate via a solder layer that engages both the die metallization layer of the sensor die and the substrate metallization layer of the ceramic substrate, wherein the ceramic substrate has an opening extending therethrough that is aligned with the cavity to form a fluid channel within the pressure sensor assembly, wherein the solder layer and the die metallization layer and the substrate metallization layer extend circumferentially around the fluid channel, and wherein the die-facing side of the ceramic substrate extends along a common plane and projects radially outwardly and away from the sensor die second side.

16. The pressure sensor assembly of claim 15, wherein the ceramic substrate has a composition that comprises alumina.

17. The pressure sensor assembly of claim 15, wherein the solder layer has a metal alloy composition that comprises tin and one or more of silver, copper, manganese, antimony, bismuth, nickel, lead, or indium.

18. The pressure sensor assembly of claim 15, wherein the substrate metallization layer of the ceramic substrate has a composition that comprises one or more of platinum, palladium, or silver.

* * * * *